United States Patent
Chen

(10) Patent No.: US 9,640,987 B2
(45) Date of Patent: May 2, 2017

(54) MULTI-STAGE DISCHARGE CIRCUIT FOR AN ELECTRONIC DEVICE AND A MULTI-STAGE DISCHARGE METHOD

(71) Applicant: Hsing-Lu Chen, Hsinchu (TW)

(72) Inventor: Hsing-Lu Chen, Hsinchu (TW)

(73) Assignee: Avision Inc. (TW)

( * ) Notice: Subject to any disclaimer, the term of this patent is extended or adjusted under 35 U.S.C. 154(b) by 162 days.

(21) Appl. No.: 14/584,564

(22) Filed: Dec. 29, 2014

(65) Prior Publication Data

US 2016/0190845 A1 Jun. 30, 2016

(30) Foreign Application Priority Data

Apr. 11, 2014 (TW) .............................. 103113421 A

(51) Int. Cl.
*H02J 7/00* (2006.01)
*H02H 9/04* (2006.01)
*H02H 3/087* (2006.01)
*H02M 1/32* (2007.01)
*H02J 7/34* (2006.01)

(52) U.S. Cl.
CPC ............ *H02H 9/045* (2013.01); *H02H 3/087* (2013.01); *H02J 7/0026* (2013.01); *H02J 7/345* (2013.01); *H02M 2001/322* (2013.01)

(58) Field of Classification Search
CPC ...... H01M 10/44; H02J 7/0065; H02J 7/0063; H02J 2007/0067
USPC .......................................................... 320/135
See application file for complete search history.

(56) References Cited

U.S. PATENT DOCUMENTS

| 2009/0295330 A1* | 12/2009 | Li | .......................... H02J 7/0013 320/124 |
| 2012/0056598 A1* | 3/2012 | Kim | ...................... H02J 7/0031 320/136 |
| 2015/0115901 A1 | 4/2015 | Zhang | |

FOREIGN PATENT DOCUMENTS

| CN | 102025357 B | 6/2012 |
| CN | 102594111 A | 7/2012 |

OTHER PUBLICATIONS

Taiwan Patent Office, "Office Action," Jul. 22, 2015.

* cited by examiner

*Primary Examiner* — Arun Williams

(57) ABSTRACT

A discharge circuit for an electronic device includes an energy storage element, a plurality of switches and a plurality of discharge paths coupled to the energy storage element and the switches. If a system power of the electronic device is turned off, a first switch of the switches conducts a first discharge path of the discharge paths, and the energy storage element is discharged through the first discharge path. In response that a voltage of the energy storage element drops to a first threshold, a second switch of the switches conducts a second discharge path of the discharge paths, and the energy storage element is discharged through the first discharge path and the second discharge path.

9 Claims, 4 Drawing Sheets

MULTI-STAGE DISCHARGE CIRCUIT FOR AN ELECTRONIC DEVICE AND A MULTI-STAGE DISCHARGE METHOD

This application claims the benefit of Taiwan application Ser. No. 103113421, filed Apr. 11, 2014, the subject matter of which is incorporated herein by reference.

BACKGROUND OF THE DISCLOSURE

Field of the Disclosure

The disclosure relates in general to a multi-stage discharge circuit for an electronic device and a multi-stage discharge method for the same.

Description of the Related Art

The electronic device may employ a high-voltage element (such as a motor and a relay). To assure smooth operation, the electronic device normally stabilizes the voltage with a large capacitor coupled to a system power. However, when the electronic device is turned off, problems such as system malfunction, system crash and electric shock may occur if the charges stored in the large capacitor are not fully and quickly discharged.

Therefore, many discharge technologies are provided to resolve the above problems. FIG. 1 and FIG. 2 show two discharge circuits.

FIG. 1 is a schematic diagram of a resident resistive type discharge circuit. As indicated in FIG. 1, the discharge circuit includes a capacitor C and a discharge resistor R which are connected in parallel. The capacitor R normally has a large resistance and is capable of bearing a large current during the discharge process. After a system power VDD is turned off, the capacitor C and the resistor R form a discharge path P1, and the charges stored in the capacitor C may be discharged through the resistor R. However, FIG. 1 is disadvantaged in that the discharge speed is not fast enough and the resistor R keeps consuming power during the normal operation of the system.

FIG. 2 is a schematic diagram of a freewheeling diode discharge circuit. As indicated in FIG. 2, the discharge circuit includes a freewheeling diode D. When the system power VDD is turned on, the freewheeling diode D is backward-biased and is not conducted. When the system power VDD is turned off, the charges of the capacitor C cause the freewheeling diode D to be forward-biased and thus conducted. Therefore, the capacitor C and the freewheeling diode D form a discharge path P2, and the charges stored in the capacitor C may be discharged through the freewheeling diode D. However, FIG. 2 is disadvantaged in that the discharge speed is not fast enough.

SUMMARY OF THE DISCLOSURE

The disclosure is directed to a multi-stage discharge circuit for an electronic device and a multi-stage discharge method for the same capable of quickly discharging through multiple discharge stages.

According to one embodiment of the present disclosure, a discharge circuit for an electronic device is disclosed. The discharge circuit includes an energy storage element, a plurality of switches and a plurality of discharge paths coupled to the energy storage element and the switches. If a system power of the electronic device is turned off, a first switch of the switches conducts a first discharge path of the discharge paths, and the energy storage element is discharged through the first discharge path. In response that a voltage of the energy storage element drops to a first threshold, a second switch of the switches conducts a second discharge path of the discharge paths, and the energy storage element is discharged through the first discharge path and the second discharge path.

According to another embodiment of the present disclosure, a discharging method for an electronic device is disclosed. A first discharge path of a plurality of discharge paths is conducted and an energy storage element of the electronic device is discharged through the first discharge path if a system power of the electronic device is turned off. A second discharge path of the discharge paths is conducted in response that a voltage of the energy storage element drops to a first threshold, and the energy storage element is discharged through the first discharge path and the second discharge path.

The above and other contents of the disclosure will become better understood with regard to the following detailed description of the preferred but non-limiting embodiment(s). The following description is made with reference to the accompanying drawings.

DETAILED DESCRIPTION OF THE DISCLOSURE

Technical terms of the disclosure are based on general definition in the technical field of the disclosure. If the disclosure describes or explains one or some terms, definition of the terms is based on the description or explanation of the disclosure. Description of the common technology or theories in this technical field is omitted here if it does not involve the technical features of the disclosure. Further, shapes, sizes and ratios of the objects are exemplary for one skilled person in the art to understand the disclosure, not to limit the disclosure.

Each of the disclosed embodiments has one or more technical features. In possible implementation, one skilled person in the art would selectively implement part or all technical features of any embodiment of the disclosure or selectively combine part or all technical features of the embodiments of the disclosure based on the disclosure of the disclosure and his/her own need.

Figure 1:
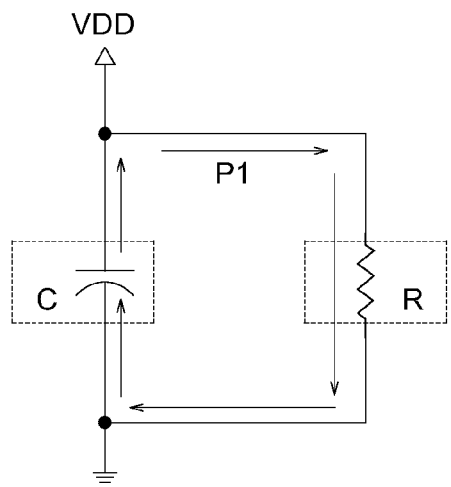
FIG. 1 is a schematic diagram of a prior resident resistive type discharge circuit.
Figure 2:
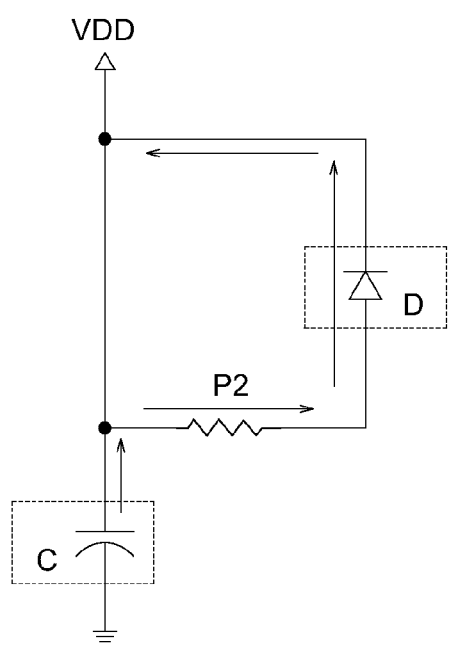
FIG. 2 is a schematic diagram of a prior freewheeling diode discharge circuit.
Figure 3:
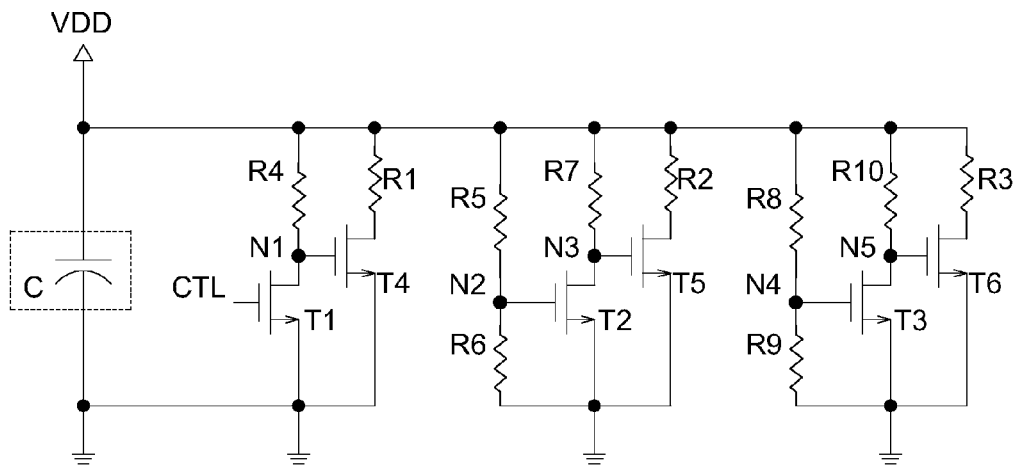
FIG. 3 is a schematic diagram of a "multi-stage discharge circuit" according to an embodiment of the disclosure.

Referring to FIG. 3, a schematic diagram of a "multi-stage discharge circuit" according to an embodiment of the disclosure is shown. As indicated in FIG. 3, the multi-stage discharge circuit according to an embodiment of the disclosure includes: a voltage stabilizing capacitor C, switch transistors T1-T6, and resistors R1-R10. Each of the switch transistors T1-T6 is exemplified by a PMOS transistor hereinafter, but the disclosure is not limited thereto. In the present embodiment of the disclosure, the switch transistor is exemplified by such as an MOS transistor, but the disclosure is not limited thereto. For example the switch transistor may also be realized by a bipolar junction transistor (BJT).

The voltage stabilizing capacitor C is coupled between a system power VDD and the ground. The switch transistor T1 includes a drain coupled to a node N1, a gate coupled to a control signal CTL, and a source grounded. Whether the switch transistor T1 is turned on or not is controlled by the control signal CTL. For example, when the electronic device is operated normally, the control signal CTL turns on the switch transistor T1; and when the electronic device is turned off (that is, the system power VDD is turned off), the control signal CTL controls the switch transistor T1 to be disconnected.

The switch transistor T2 includes a drain coupled to a node N3, a gate coupled to a node N2, and a source grounded. The switch transistor T3 includes a drain coupled to a node N5, a gate coupled to a node N4, and a source grounded.

The switch transistor T4 includes a drain coupled to the resistor R1, a gate coupled to the node N1, and a source grounded. The switch transistor T5 includes a drain coupled to the resistor R2, a gate coupled to the node N3, and a source grounded. The switch transistor T6 includes a drain coupled to the resistor R3, a gate coupled to the node N5, and a source grounded.

The resistor R1 is coupled between the system power VDD and the switch transistor T4. In discharging, the resistor R1 and the switch transistor T4 form a discharge path. The resistor R2 is coupled between the system power VDD and the switch transistor T5. In discharging, the resistor R2 and the switch transistor T5 form another discharge path. The resistor R3 is coupled between the system power VDD and the switch transistor T6. In discharging, the resistor R3 and the switch transistor T6 form an alternate discharge path.

The resistor R4 is coupled between the system power VDD and the switch transistor T1. The resistor R7 is coupled between the system power VDD and the switch transistor T2. The resistor R10 is coupled between the system power VDD and the switch transistor T3. The resistor R5 and R6 form a voltage divider. The resistor R5 is coupled between the system power VDD and the node N2. The resistor R6 is coupled between the ground and the node N2. The resistor R8 and R9 form another voltage divider. The resistor R8 is coupled between the system power VDD and the node N4. The resistor R9 is coupled between the ground and the node N4.

Under normal operation (that is, the electronic device is turned-on), the switch transistor T1 is conducted under the control of the control signal CTL. Since the switch transistor T1 is conducted, the voltage of the node N1 is too low to conduct the switch transistor T4, and the switch transistor T4 is turned off accordingly. Through the voltage division by the resistor R5 and the resistor R6, the voltage of the node N2 is high enough to conduct the switch transistor T2 if the system power VDD is on. Since the switch transistor T2 is conducted, the voltage of the node N3 is too low to conduct the switch transistor T5, and the switch transistor T5 is turned off accordingly.

Similarly, through the voltage division by the resistor R8 and the resistor R9, the voltage of the node N4 is high enough to conduct the switch transistor T3 if the system power VDD is on. Since the switch transistor T3 is conducted, the voltage of the node N5 is too low to conduct the switch transistor T6, and the switch transistor T6 is turned off accordingly. That is, if the system power VDD is on, the switch transistors T1-T3 are conducted, but the switch transistors T4-T6 are turned off.

How the "multi-stage discharge circuit" according to an embodiment of the disclosure achieves multi-stage discharge is disclosed below.

Figure 4A:
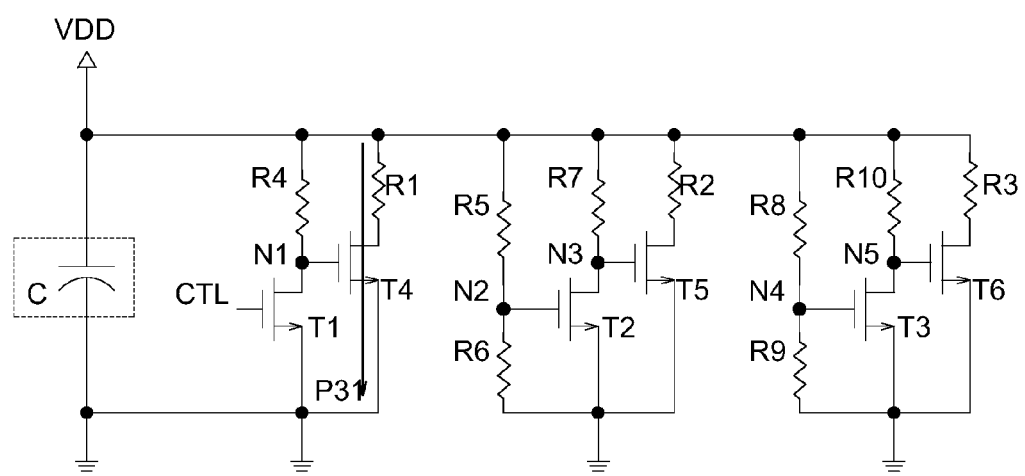
FIG. 4A-FIG. 4C are schematic diagrams of the multi-stage discharge performed by a multi-stage discharge circuit according to an embodiment of the disclosure.
Figure 4B:
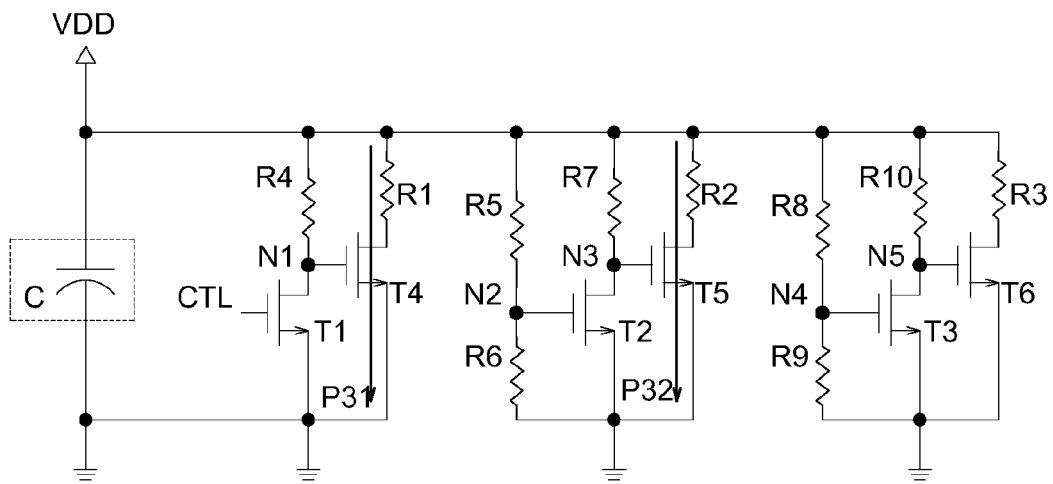
Figure 4C:
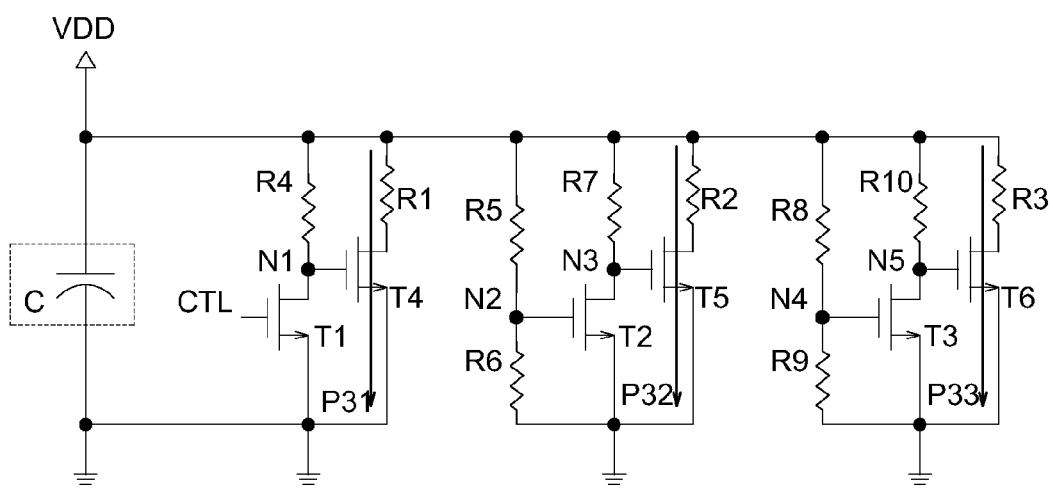

FIG. 4A-FIG. 4C are schematic diagrams of multi-stage discharge performed by a multi-stage discharge circuit according to an embodiment of the disclosure.

As indicated in FIG. 4A, during a first discharge stage, after the system power VDD is turned off, the control signal CTL controls the switch transistor T1 to be turned off. Since the switch transistor T1 is turned off, the resistor R4 is in a floating status, and the voltage of the node N1 is almost equivalent to that of the capacitor C. This is because when the system power VDD is just turned off, the voltage of the capacitor C is almost equivalent to the normal value of the system voltage VDD. Therefore, the voltage of the node N1 is high enough to conduct the switch transistor T4, and a discharge path P31 is accordingly formed by the resistor R1 and transistor T4.

Next, as the capacitor C is discharged through the discharge path P31, the voltage of the capacitor C gradually decreases. As the voltage of the capacitor C gradually decreases, the voltage of the node N2 also decreases. If the voltage of the node N2 decreases to a level too low to conduct the switch transistor T2, the switch transistor T2 becomes turned off and the discharge circuit enters a second discharge stage. Similarly, since the switch transistor T2 is turned off, the resistor R7 is in a floating status, such that the voltage of the node N3 is almost equivalent to the voltage of the capacitor C. Therefore, the voltage of the node N3 is high enough to conduct the switch transistor T5 and a discharge path P32 as indicated in FIG. 4B is accordingly formed by the resistor R2 and transistor T5.

Similarly, as the capacitor C is discharged through the discharge paths P31 and P32, the voltage of the capacitor C gradually decreases. As the voltage of the capacitor C gradually decreases, the voltage of the node N4 also decreases. If the voltage of the node N4 decreases to a level too low to conduct the switch transistor T3, the switch transistor T3 becomes turned off, and the discharge circuit enters a third discharge stage. Similarly, since the switch transistor T3 is turned off, the resistor R10 is in a floating status, such that the voltage of the node N5 is almost equivalent to the voltage of the capacitor C. Therefore, the voltage of the node N5 is high enough to conduct the switch transistor T6, and a discharge path P33 as indicated in FIG. 4C is formed by the resistor R3 and transistor T6 accordingly.

The resistance relationship among the resistors R1, R2 and R3 is expressed as R1>R2>R3 but the resistor size relationship among the resistors R1, R2 and R3 is expressed as R1<R2<R3. The resistance relationship is arranged as R1>R2>R3 because of following reasons. During the first discharge stage, the voltage of the capacitor C is still at a high level, therefore it needs a high-resistance resistor R1 to avoid a large current (which may burn the switch transistor T1) flowing through the switch transistor T1. During the third discharge stage, the voltage of the capacitor C has decreased considerably, therefor the resistor R3 does not need to have a large resistance. The resistor size relationship is arranged as R1<R2<R3 because a small-resistance resistor (R3) is helpful in quick discharge but a large size resistor (R3) is helpful in consideration of power consumption.

During the first discharge stage, discharge is through the discharge path P31. During the second discharge stage, discharge is through the discharge paths P31 and P32.

During the third discharge stage, discharge is through the discharge paths P31, P32 and P33. Therefore, during the second discharge stage, the total resistance of the discharge paths is equivalent to the parallel resistance of the resistors R1 and R2. During the third discharge stage, the total resistance of the discharge paths is equivalent to the parallel resistance of the resistors R1 and R2 and R3. Since the total resistance of the discharge paths decreases in the second stage, the discharge may be more quickly.

Figure 5:
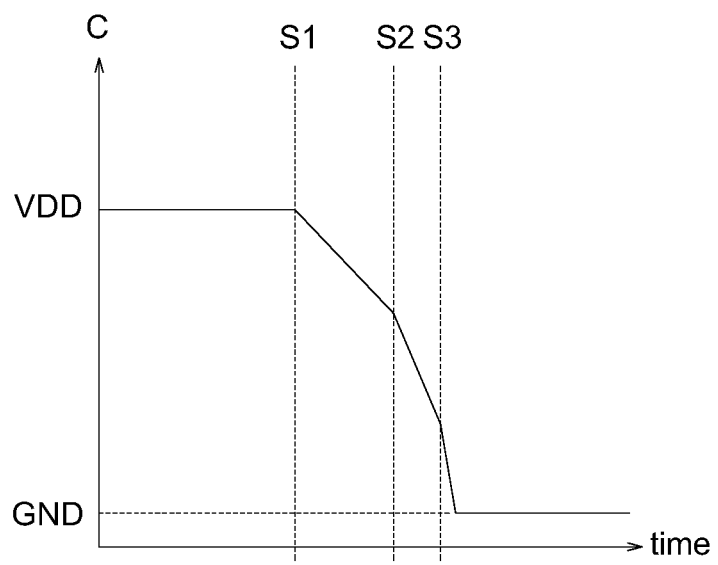
FIG. 5 is a schematic diagram of discharging waveforms according to an embodiment of the disclosure.

FIG. 5 is a schematic diagram of discharging waveforms according to an embodiment of the disclosure. FIG. 5 shows a waveform of the voltage of the capacitor C. In FIG. 5, S1 represents the start of the first discharge stage, S2 represents the start of the second discharge stage, and S3 represents the start of the third discharge stage. In the present example, the system power VDD is exemplified by 24V.

As indicated in FIG. 5, the voltage of the capacitor C decreases from the beginning of the first discharge stage. When the voltage of the capacitor C decreases to be about 11V (referred as the first threshold), the switch transistor T2 will be turned off but the switch transistor T5 will be conducted, and the second discharge stage begins. During the second discharge stage, the capacitor C is discharged through both two discharge paths P31 and P32, therefore the discharge speed during the second discharge stage is faster than that during the first discharge stage.

Similarly, when the voltage of the capacitor C decreases to be about 6V (referred as the second threshold), the switch transistor T3 will be turned off but the switch transistor T6 will be conducted, and the third discharge stage begins. The capacitor C is discharged through three discharge path P31, P32 and P33 from the beginning of the third discharge stage, therefore the discharge speed during the third stage is faster than that during the first stage and the second stage. As indicated in FIG. 5, in the embodiment of the disclosure, the capacitor C may be effectively and quickly discharged.

Although three discharge paths and three discharge stages are exemplified in above embodiments, the disclosure is not limited thereto. If necessary, the discharge circuit may include more discharge paths (more discharge stages) to achieve quick discharge. In another embodiment of the disclosure, the discharge circuit may include two discharge paths (two discharge stages), which is still within the spirit of the disclosure.

In an embodiment of the disclosure, the discharge time and speed may be adjusted through the adjustment in the resistance of the resistors R1-R3, R5-R6 and R8-R9.

The discharge circuit of the embodiments of the disclosure may achieve quick discharge to reduce the problems caused by residual charges such as system malfunction, system crash and electric shock.

While the disclosure has been described by way of example and in terms of the preferred embodiment (s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A discharge circuit for an electronic device, comprising:
   an energy storage element;
   a plurality of switches; and
   a plurality of discharge paths coupled to the energy storage element and the switches;
   wherein, when a system power of the electronic device is turned off, a first switch of the switches is transited from a connection state to a disconnection state for conducting a first discharge path of the discharge paths and the energy storage element is discharged through the first discharge path; and
   a second switch of the switches is transited from a connection state to a disconnection state for conducting a second discharge path of the discharge paths in response that a voltage of the energy storage element drops to a first threshold, and the energy storage element is discharged through the first discharge path and the second discharge path.

2. The discharge circuit for an electronic device according to claim 1, wherein:
   a third switch of the switches is transited from a connection state to a disconnection state for conducting a third discharge path of the discharge paths in response that the voltage of the energy storage element drops to a second threshold from the first threshold, and the energy storage element is discharged through the first discharge path, the second discharge path and the third discharge path.

3. The discharge circuit for an electronic device according to claim 1, wherein:
   if the system power of the electronic device is turned on, the first switch and the second switch are conducted.

4. The discharge circuit for an electronic device according to claim 1, wherein:
   the first switch of the switches is controlled by a control signal;
   if the system power of the electronic device is turned off, the control signal turns off the first switch.

5. The discharge circuit for an electronic device according to claim 1, further comprising:
   a plurality of voltage dividing circuits coupled to the switches, for dividing the voltage of the energy storage element;
   wherein, after the voltage of the energy storage element drops to the first threshold, a first voltage dividing circuit of the voltage dividing circuits turns off the second switch of the switches for conducting the second discharge path of the discharge paths, and the energy storage element is discharged through the first discharge path and the second discharge path.

6. A discharging method for an electronic device, comprising:
   when a system power of the electronic device is turned off, conducting a first discharge path of a plurality of discharge paths by transiting a first switch from a connection state to a disconnection state and discharging an energy storage element of the electronic device through the first discharge path;
   in response that a voltage of the energy storage element drops to a first threshold, conducting a second discharge path of the discharge paths by transiting a second switch from a connection state to a disconnection state and discharging the energy storage element through the first discharge path and the second discharge path.

7. The discharging method for an electronic device according to claim 6, further comprising:
   in response that the voltage of the energy storage element drops to a second threshold from the first threshold, conducting a third discharge path of the discharge paths by transiting a third switch from a connection state to a disconnection state and discharging the energy storage element through the first discharge path, the second discharge path and the third discharge path.

8. The discharging method for an electronic device according to claim 6, wherein:
if the system power of the electronic device is turned on, the first switch and the second switch are conducted.

9. The discharging method for an electronic device according to claim 6, further comprising:
if the system power of the electronic device is turned off, the first switch is turned off for conducting the first discharge path.

* * * * *